United States Patent [19]

Hase et al.

[11] Patent Number: 5,557,974
[45] Date of Patent: Sep. 24, 1996

[54] TORQUE SENSOR USING MAGNETOSTRICTIVE ALLOY AND METHOD OF MANUFACTURING THE SAME

[75] Inventors: Hiroyuki Hase, Kyoto; Rihito Shoji, Yawata, both of Japan

[73] Assignee: Matsushita Electric Industrial Co., Ltd., Osaka, Japan

[21] Appl. No.: 294,027

[22] Filed: Aug. 24, 1994

[30] Foreign Application Priority Data

Aug. 26, 1993 [JP] Japan .................................. 5-211234

[51] Int. Cl.⁶ .......................................................... G01L 3/00
[52] U.S. Cl. .............................. 73/862.335; 73/862.333
[58] Field of Search .................... 73/862.333, 862.335, 73/862.336

[56] References Cited

U.S. PATENT DOCUMENTS

| | | | |
|---|---|---|---|
| 4,823,617 | 4/1989 | Hase et al. | 73/862.335 |
| 4,986,137 | 1/1991 | Sato et al. | 73/862.335 |
| 5,142,919 | 9/1992 | Satoh et al. | |
| 5,193,267 | 3/1993 | Satoh et al. | |
| 5,353,649 | 10/1994 | Hase et al. | 73/862.335 |
| 5,442,966 | 8/1995 | Hase et al. | 73/862.335 |

FOREIGN PATENT DOCUMENTS

| | | |
|---|---|---|
| 525551 | 2/1993 | European Pat. Off. . |
| 4016955 | 12/1990 | Germany . |
| 60-50429 | 3/1985 | Japan . |

Primary Examiner—Kenneth A. Wieder
Assistant Examiner—Ronald Biegel
Attorney, Agent, or Firm—Fish & Richardson P.C.

[57] ABSTRACT

A torque sensor including a magnetostrictive alloy ribbon having plural rows of plural hole groups arranged longitudinally in the direction at a required angle to the shaft, and the magnetostrictive alloy ribbon is glued to the surface of the shaft, and means for detecting magnetic change are arranged around the magnetostrictive alloy ribbon in order to detect torque.

12 Claims, 15 Drawing Sheets

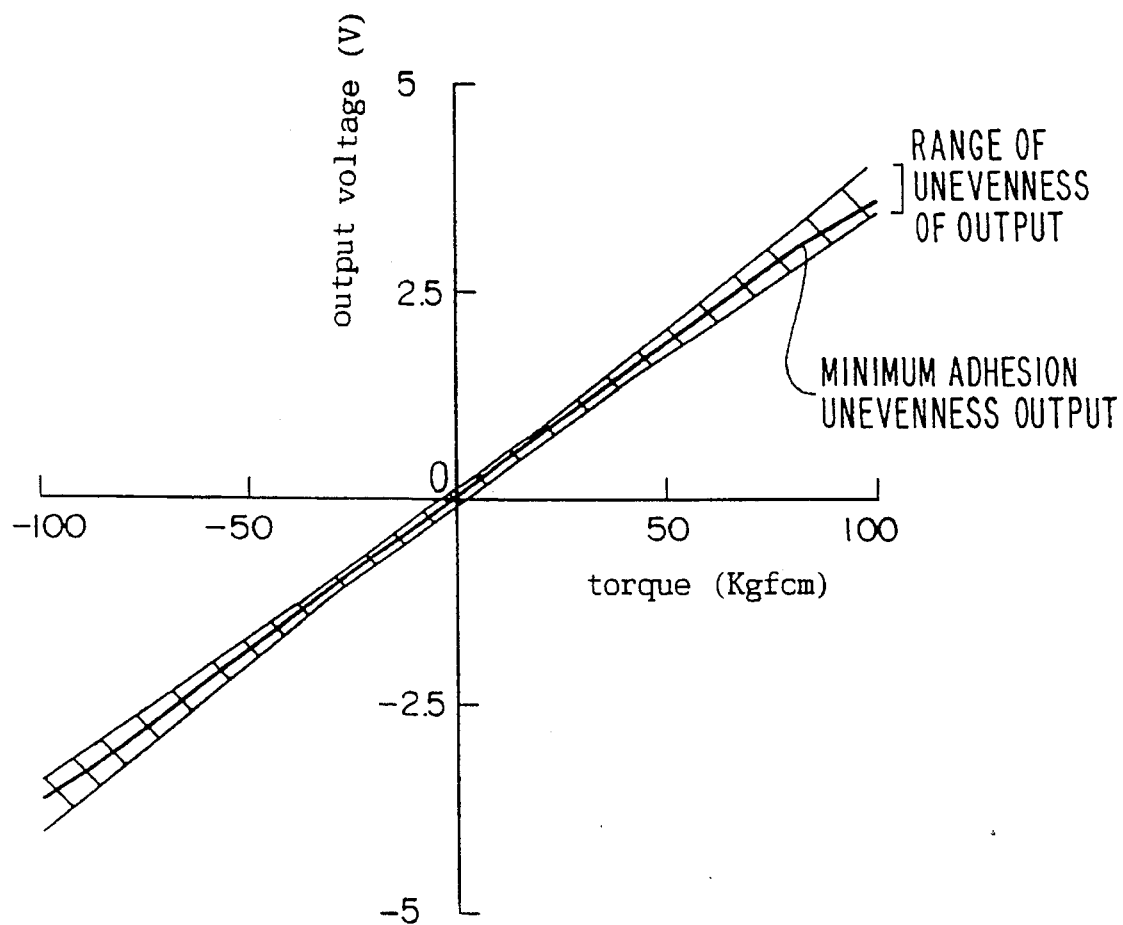
F I G. 1 2

TORQUE SENSOR USING MAGNETOSTRICTIVE ALLOY AND METHOD OF MANUFACTURING THE SAME

FIELD OF THE INVENTION

This invention relates to a torque sensor which comprises magnetostrictive alloy ribbon and which can be used for noncontact detection. This invention also relates to a torque sensor which can be used. for the purposes of e.g. detecting rotary operation force of a vehicle's (especially electromobile's) steering wheel, detecting torque of a machine to take up synthetic fiber, or detecting viscosity of materials. This invention also relates to a method of manufacturing the torque sensor.

BACKGROUND OF THE INVENTION

Torque sensors made from amorphous magnetic alloy having magnetostriction, or Fe-based alloy having magnetostriction, have been known. For example, Published Unexamined Japanese Patent Application No. Hei 3-26339 discloses a torque sensor which has a metal shaft whereon an amorphous magnetostrictive alloy ribbon sensitive to stress is glued. Elongated slits are formed on the amorphous magnetostrictive alloy ribbon of the torque sensor. The angles of the slits are +45° and −45° to the shaft longitudinally, if the magnetostrictive alloy ribbon adheres to the shaft's surface. FIG. 10 shows an amorphous magnetostrictive alloy ribbon 21 by the prior art. The letters in the figure are described as follows: a'=35.8 mm (i'=1 mm, h'=1 mm) long, b'=25.0 mm (c'=10.5 mm, d'=10.5 mm, e'=1 mm, f'=2 mm, g'=1 mm) wide. The width of slit s is 0.3 mm. The repetition pitch (spacing between the two slits) t is 2.0 mm. The angle of the slits ($\epsilon$) is 45°. Longitudinal a' is circumferential in use for the torque sensor. The slits are used to detect the torque's direction. Coil means are arranged outside of the amorphous magnetostrictive alloy ribbon in order to detect magnetic property. By the application of torque to the shaft, tensile and compression stresses are generated at +45° and −45° to the shaft's surface longitudinally. This results in changes in magnetic property of the slits at +45° and −45° on the amorphous magnetostrictive alloy ribbon. The difference of the changes in magnetic property is detected by coil means, thus the direction and magnitude of the torque is detected.

Manufacturing methods of such a torque sensor are explained below:

forming by force an amorphous plate cylindrically and gluing it; or forming an amorphous plate cylindrically by annealing to adjust almost the diameter of the shaft, and then gluing it.

In the former method, a flat metal ribbon is formed cylindrically and glued. Therefore, plural rows of slits formed on the metal ribbon might be distorted when bent, which is one of the causes of unevenness or damage to the metal ribbon. In the latter method, a metal ribbon is fixed to a metal cylindrical jig and annealed. A problem with this method is distortions of the slits in the process of fixing the ribbon to the jig, which resulted in damage to the ribbon. The encircled parts of a metal ribbon 22 in FIG. 11 ($u_1$ to $u_7$) show that certain parts of the slits are often damaged, which might lead to a low yield of the product. With respect to the magnetic anisotropy provided by the slits, inner distortions are often caused even if there is no damaged part. As a result, good linear output is not obtained over a wide range of torque.

SUMMARY OF THE INVENTION

An object of the invention is to decrease damage to a magnetostrictive alloy ribbon and reduce unevenness in output of a torque sensor during manufacturing by improving the shape of the slits in a magnetostrictive alloy ribbon.

In order to accomplish these and other objects and advantages, a torque sensor of this invention comprises a magnetostrictive alloy ribbon fixed to a surface of a shaft, and means for detecting magnetic change arranged outside said ribbon, wherein the magnetostrictive alloy ribbon possesses plural rows of plural holes disposed at a required angle with respect to the shaft longitudinally.

It is preferable in this invention that the magnetostrictive alloy ribbon is formed cylindrically, so that the longitudinal direction is substantially vertical, and capable of withstanding a load of 10 g or more uniformly applied on top of the ribbon.

It is more preferable in this invention that the magnetostrictive alloy ribbon is formed cylindrically, so that the longitudinal direction is substantially vertical, and capable of withstanding a load of 80 g or more uniformly applied on top of the ribbon.

It is preferable in this invention that the dimension of the holes is from 2 to 5 mm long, and from 0.1 to 2 mm wide.

It is preferable in this invention that the holes are positioned in a line, and the spacing between adjacent holes in a line is from 0.1 to 1 mm, and the spacing between adjacent lines is from 0.5 to 5 mm.

It is preferable in this invention that the plural hole lines are arranged obliquely in two directions to the shaft longitudinally.

It is preferable in this invention that the oblique angles are about +45° and about −45°.

It is preferable in this invention that the holes have a curved shape.

It is preferable in this invention that the curved shape is at least one shape selected from the group consisting of a circle, an ellipse, and an oval.

It is preferable in this invention that the magnetostrictive metal ribbon comprises amorphous magnetostrictive alloy.

It is preferable in this invention that the amorphous magnetostrictive alloy is at least one member selected from the group consisting of Fe—Cr—Si—B-based, Fe—Nb—Si—B-based, Fe—V—Si—B-based, Fe—Co—Si—B-based, Fe—W—Si—B-based, Fe—Ni—Cr—Si—B-based, Fe—Ni—Nb—B-based, and Fe—Ni—Mo—B-based alloy.

It is preferable in this invention that the composition of the amorphous magnetostrictive alloy is Fe:b 75atom %, Cr:4 atom %, Si:12.5 atom %, B:8.5 atom % (hereinafter, $Fe_{75}Cr_4Si_{12.5}B_{8.5}$).

It is preferable in this invention that the means for detecting magnetic change is a coil means.

It is preferable in this invention that the unevenness of the output voltage is 10% or less per full-scale of torque (100 kgfcm).

It is preferable in this invention that when represented graphically the characteristics show substantially a straight line.

A method of manufacturing a torque sensor of this invention comprising the steps of:

etching a magnetostrictive alloy ribbon to form plural rows of plural holes disposed at a required angle;

winding the magnetostrictive alloy ribbon on a cylindrical inner structure whose diameter is substantially equal to the diameter of the shaft;

placing the magnetostrictive alloy ribbon and the inner structure inside a cylindrical outer structure which is hollow;

curling the magnetostrictive alloy ribbon by annealing.

It is preferable in this method that the annealing temperature ranges from 350° C. to 600° C. It is especially preferable that the annealing temperature is the crystalization temperature or less of the magnetostrictive alloy, and is suitable for curling the magnetostrictive alloy ribbon.

It is preferable in this method that the annealing atmosphere is at least one non-oxidizing atmosphere selected from the group consisting of an inert atmosphere and a depressurized atmosphere.

It is preferable in this method that the depressurized atmosphere ranges from 1 torr to $1 \times 10^{-6}$ torr.

It is preferable in this method that the inert atmosphere is at least one gas selected from the group consisting of Ar, He, Ne, $N_2$, and CO.

It is preferable in this method that the material of the inner structure has a high coefficient of thermal expansion while the material of the outer structure has a low coefficient of thermal expansion.

It is preferable in this method that the distance between the inner structure and the outer structure ranges from 10 to 500 μm.

The magnetostrictive alloy ribbon of the torque sensor of the invention as mentioned above has plural rows of plural hole groups arranged at a required angle to a shaft longitudinally, which can decrease damage to the magnetostrictive alloy ribbon and reduce the output unevenness of the torque sensor during manufacturing. The reason for this is as follows. Plural rows of plural hole groups are formed instead of slits of the prior art, which increased sequent parts in the direction of the face of the magnetostrictive alloy ribbon. As a result, even if stress is applied, the force is not concentrated but scattered, and therefore the strength is increased.

It is preferable in this method that the magnetostrictive alloy ribbon is formed cylindrically, so that the longitudinal direction is substantially vertical, and is capable of withstanding a load of 10 g or more uniformly applied on top of the ribbon, which can decrease damage to the magnetostrictive alloy ribbon and reduce output unevenness of a torque sensor during manufacturing.

It is more preferable in this method that the magnetostrictive alloy ribbon is formed cylindrically, so that the longitudinal direction is substantially vertical, and is capable of withstanding a load of 80 g or more uniformly applied on top of the ribbon, which can decrease damage to the magnetostrictive alloy ribbon and reduce output unevenness of a torque sensor during manufacturing.

It is preferable in this method that the dimension of the holes comprising the hole groups is from 2 to 5 mm long, and from 0.1 to 2 mm wide, which can decrease damage to the magnetostrictive alloy ribbon, and reduce output unevenness of a torque sensor during manufacturing.

It is preferable in this method that the hole groups form lines, and the spacing between adjacent holes in the same line is from 0.1 to 1 mm, and the spacing between two lines is from 0.5 to 5 mm, which can decrease damages of the magnetostrictive alloy ribbon and reduce output unevenness of a torque sensor during manufacturing.

It is preferable in this method that the plural hole lines and groups are arranged obliquely in two directions to the shaft longitudinally, which can detect more precisely the longitudinal and circumferential distortion. It is especially preferable that the oblique angle is substantially +45° and −45°.

It is preferable in this method that the holes have a curved shape, which is hardly damaged under stress. It is especially preferable in this method that the shape is at least one shape selected from the group consisting of a circle, an ellipse, and an oval.

It is preferable in this method that the magnetostrictive metal ribbon comprises amorphous magnetostrictive alloy, which can detect torque precisely. It is especially preferable in this method that the amorphous magnetostrictive alloy is at least one member selected from the group consisting of Fe—Cr—Si—B-based, Fe—Nb—Si—B-based, Fe—V—Si—B-based, Fe—Co—Si—B-based, Fe—W—Si—B-based, Fe—Ni—Cr—Si—B-based, Fe—Ni—Nb—B-based, and Fe—Ni—Mo—B-based alloy.

It is preferable in this method that the means for detecting magnetic change is a coil :means, which enables the detection of torque more precisely.

It is preferable in this method that the unevenness of the output voltage is 10% or less of the torque's full-scale (100 kgfcm), which enables the detection of torque more precisely. It is also preferable in this method that when represented graphically the characteristics show substantially a straight line.

According to the manufacturing method of this invention, above-mentioned torque sensor can be manufactured efficiently.

It is preferable in this method that the annealing temperature ranges from 350° C. to 600° C, which is suitable for curling the magnetostrictive metal ribbon.

It is preferable in this method that the annealing atmosphere is at least one non-oxidizing atmosphere selected from the group consisting of an inert atmosphere and a depressurized atmosphere, which can be suitable for inhibiting the oxidation of the magnetostrictive alloy ribbon and curling the magnetostrictive alloy ribbon. It is also preferable as a nonoxidizing atmosphere that the depressurized atmosphere ranges from 1 torr to $1 \times 10^{-6}$ torr, or that the inert atmosphere is at least one gas selected from the group consisting of Ar, He, Ne, $N_2$, and CO.

It is preferable in thins method that the material of the inner structure has a high coefficient of thermal expansion while the material of the outer structure has a low coefficient of thermal expansion. In this case, the distance between the inner structure and the outer structure at room temperature may be reduced because the addition of the heat in annealing will have less effect, which will make it possible to wind the magnetostrictive metal ribbon uniformly. It will also make it possible to place the inner structure within the outer structure more efficiently at room temperature. Softer metals like brass, copper, and aluminum are preferred for the material of the inner structure, because the metals have high coefficients of thermal expansion. On the other hand, titanium, titanium steel, steel, Fe-nickel steel, stainless steel, nickel and the like are preferred for the material of the outer structure, because the metals have low coefficients of thermal expansion.

It is preferable in this method that the distance between the inner structure and the outer structure ranges from 10 to 500 μm, which is more suitable to curl the magnetostrictive metal ribbon uniformly.

The method of this invention does not generate distortions of slits which have been generated in the manufacturing process of the prior art. As a result, output repeatability of the torque sensor may be improved since damage can be prevented.

BRIEF DESCRIPTION OF THE DRAWINGS

FIG. 5(a) shows the process of winding cylindrically the magnetostrictive metal ribbon on an inner structure, and FIG. 5(b) shows the process of applying an outer structure on the magnetostrictive metal ribbon and annealing.

FIG. 9(a) shows the process of placing a cylindrical magnetostrictive metal ribbon on a plate glass and then placing another plate glass on the cylindrical magnetostrictive metal ribbon. FIG. 9(b) shows the process of placing a weight on the plate glass on the cylindrical magnetostrictive metal ribbon.

FIG. 12 shows an example of the optimum output and unevenness range of a torque sensor which was formed with elliptic holes of one embodiment of the invention.

DESCRIPTION OF THE PREFERRED EMBODIMENTS

Table 1 shows some examples of the materials of an amorphous magnetostrictive alloy ribbon suitable for use in this invention. Table 1 also shows the crystallization temperature of the materials.

TABLE 1

| Composition (atom %) | Crystallization Temperature(°C.) |
|---|---|
| $Fe_{75}Cr_4Si_{12.5}B_{8.5}$ | 460 |
| $Fe_{70}Cr_4Si_{16}B_{10}$ | 480 |
| $Fe_{80}NbSi_6B_{13}$ | 510 |
| $Fe_{79}V_2Si_6B_{13}$ | 480 |
| $Fe_{70}CO_8Si_{13}B_9$ | 520 |
| $Fe_{74}W_2Si_{10}B_{15}$ | 560 |
| $Fe_{40}Ni_{35}Cr_4Si_{12}B_9$ | 440 |
| $Fe_{40}Ni_{39}Nb_2B_{19}$ | 400 |
| $Fe_{40}Ni_{38}Mo_4B_{18}$ | 390 |

Figure 1:
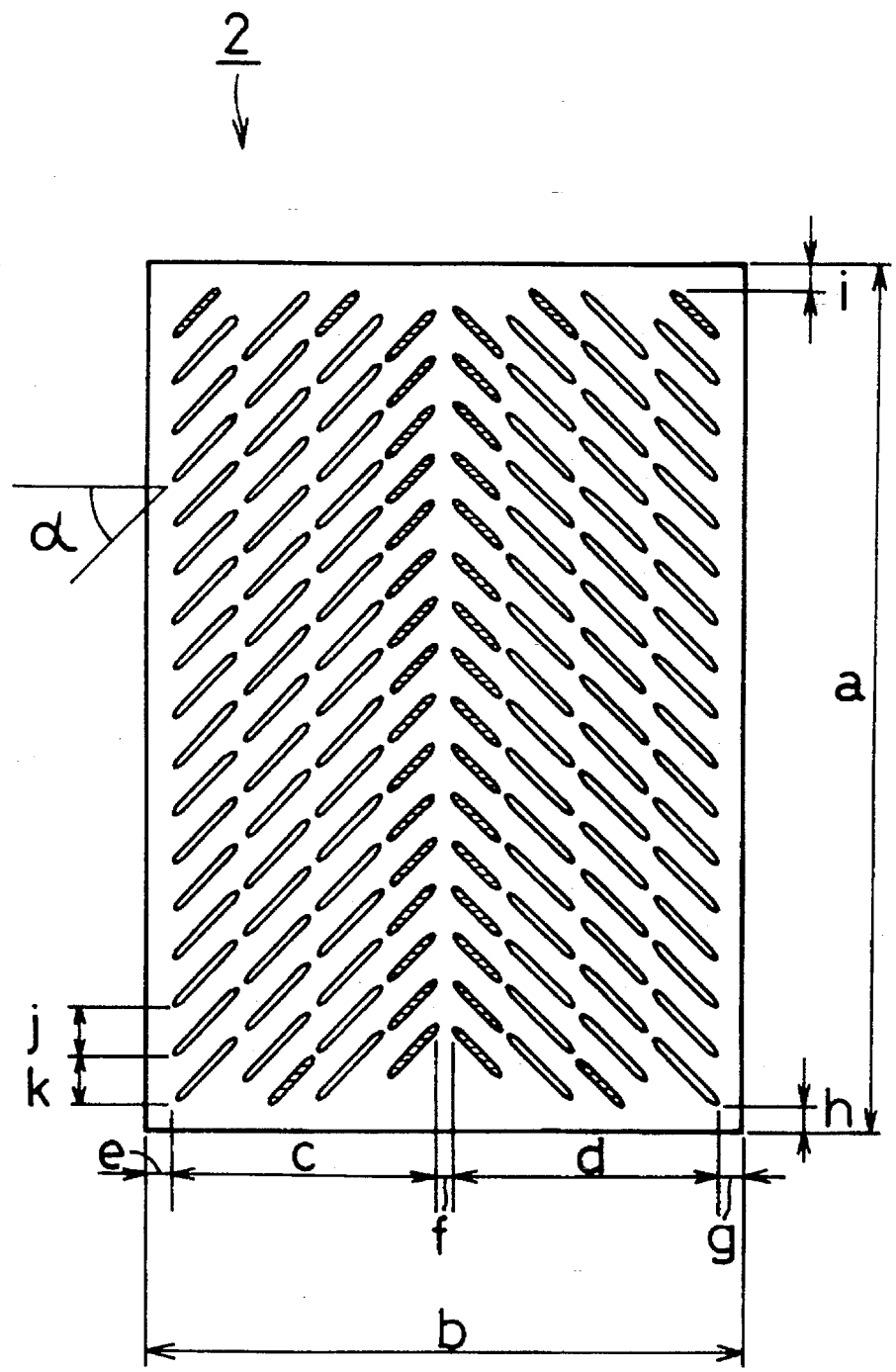
FIG. 1 shows an exploded view of a magnetostrictive metal ribbon which is used for a torque sensor of one embodiment of the invention.

FIG. 1 shows an exploded view of the magnetostrictive metal ribbon which is used for the torque sensor of one embodiment of the invention. The number 2 in FIG. 1 is the amorphous magnetostrictive metal ribbon. The composition of the amorphous magnetostrictive alloy ribbon 2 was $Fe_{75}Cr_4Si_{12.5}B_{8.5}$. The thickness was 32 μm, the crystallization temperature was 460° C., the saturation magnetostriction constant was 22 ppm. The magnetostrictive alloy ribbon 2 was produced by a single roller rapid quenching technique (e.g. it was rapidly quenched from 1,400° C. to room temperature at 10,000° C. per second). The dimensions were: 35.8 mm (i=1 mm, h=1 mm) long (a), and 25.0 mm (c=11 mm, d=11 mm, e=1 mm, f=1 mm, g=1 mm) wide (b), the angle of hole lines α was 45°. The center distances between two hole lines (j and k) were 2 mm respectively. The above-mentioned holes were produced by an etching process. The direction of longitudinal (a) becomes circumferential when used for a torque sensor. The white holes and slashed holes in FIG. 1 are a little different in dimension, which is explained in FIG. 2.

Figure 2:
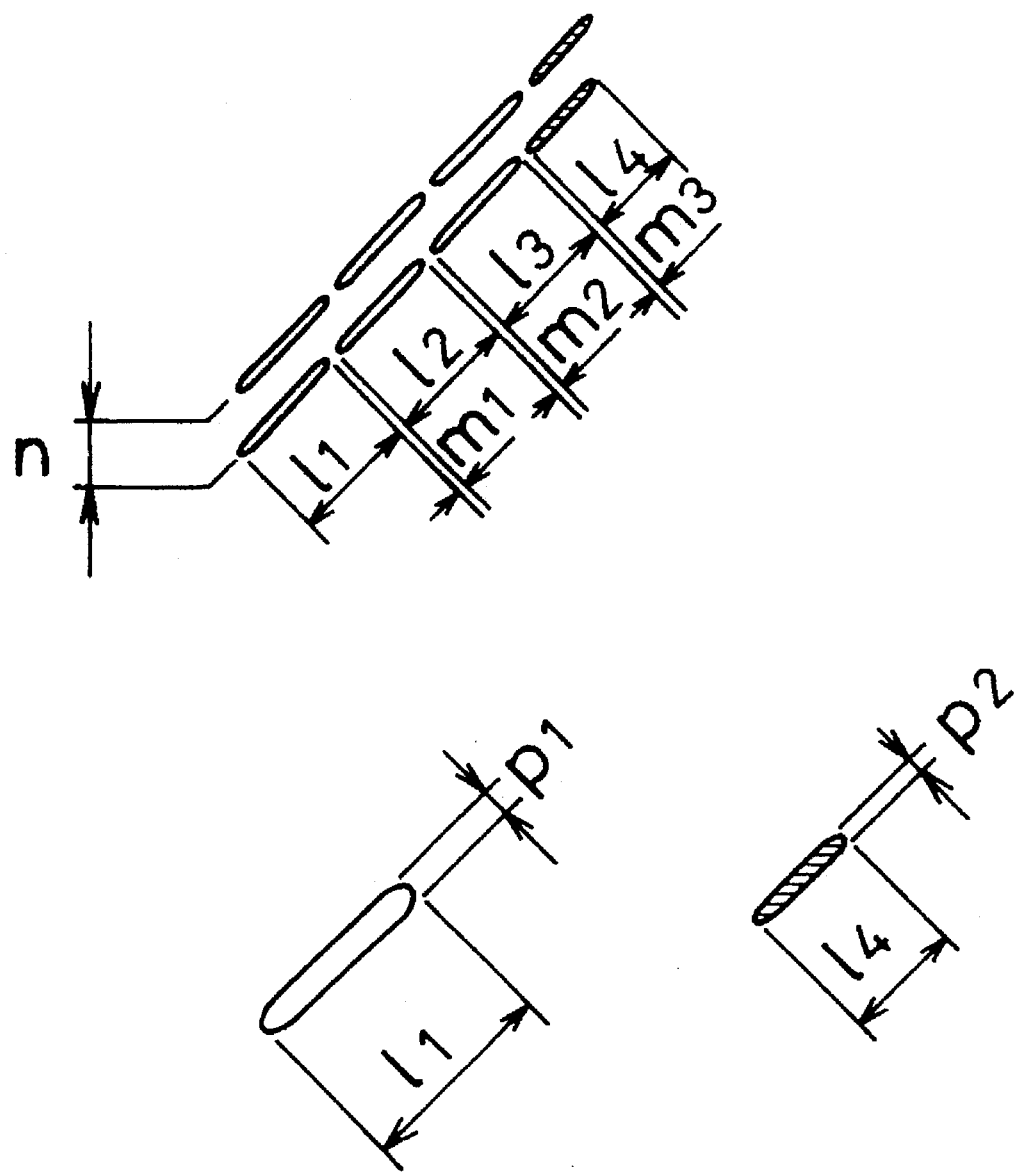
FIG. 2 shows an enlarged section view of holes of the torque sensor of FIG. 1.

The white hole (ellipse) and the slashed hole (ellipse) in FIG. 2 are equivalent to the ones in FIG. 1 respectively. The white holes are 4 mm long ($l_1$ to $l_3$) and 0.3 mm wide ($p_1$). The slashed hole is 2.95 mm long ($l_4$) and 0.3 mm wide ($p_2$). The center distance between a hole line and the next one (n) is 2 mm.

Figure 3:
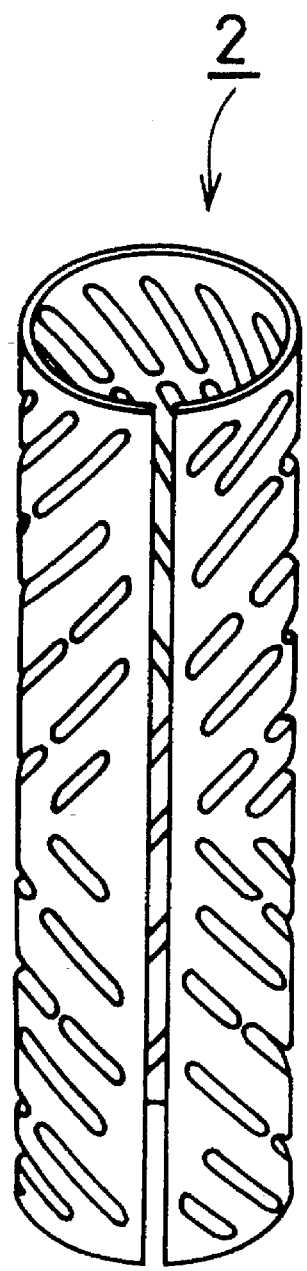
FIG. 3 shows a view of forming the magnetostrictive metal ribbon into cylindrical shape. The ribbon is used for a torque sensor of one embodiment of the invention.
Figure 5A:
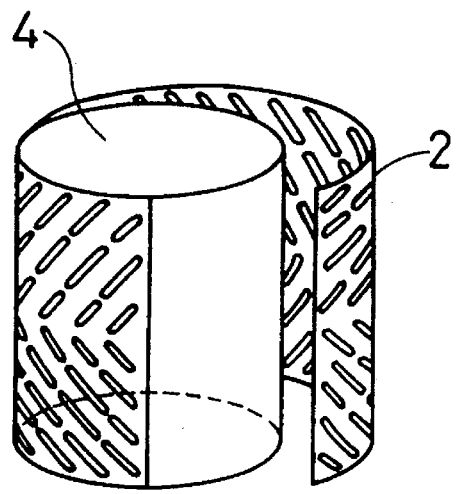
FIG. 5(a) and FIG. 5(b) explain the process of forming cylindrically a magnetostrictive metal ribbon of one embodiment of the invention.
Figure 5B:
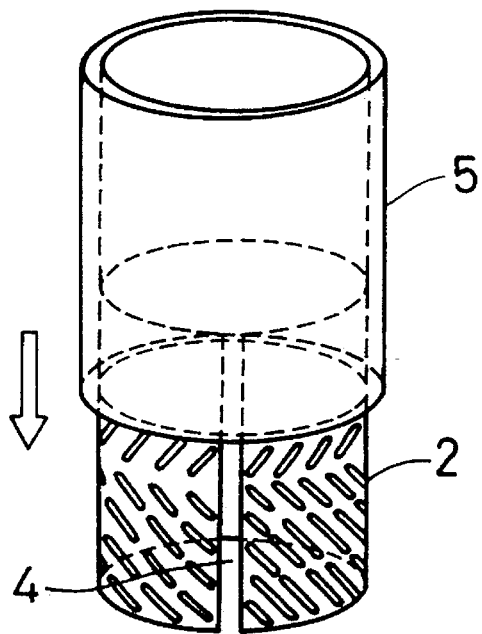

The following is FIG. 3 which shows the formation of a magnetostrictive metal ribbon 2 into a cylindrical shape, which is used for a torque sensor of one embodiment of the invention. This was produced by etching the amorphous magnetostrictive alloy ribbon 2 and giving it a cylindrical curl by annealing (440° C.) to fit the periphery of the inner structure 4 in FIG. 5(a). FIG. 5(a) shows an example of the process for curling the amorphous magnetostrictive alloy ribbon 2. The number 4 in the figure is a brass inner structure whose periphery is equal in the peripheral diameter to the diameter of the shaft (11.80 mm at 20° C.). The number 5 is an outer structure whose inner diameter is processed about 130 μm larger than the peripheral diameter of the inner structure (11.93 mm at 20° C.). Titanium steel was used for the material. As shown in FIG. 5(b), the magnetostrictive alloy ribbon was placed between the inner structure 4 and the outer structure 5, and distorted cylindrically. In this condition, the magnetostrictive alloy ribbon was annealed in a vacuum at 440° C. (at the crystallization temperature or less) for 40 minutes to be curled.

The coefficient of thermal expansion of the titanium steel was $9.4 \times 10^{-6}$/°C., and the coefficient of thermal expansion of the brass was $22 \times 10^{-6}$/°C. Annealed to 440° C., the peripheral diameter of the inner structure was 11.8 mm×[1+ $22 \times 10^{-6} \times (440-20)$]=11.909 mm. Annealed to 440° C., the inner diameter of the outer structure was 11.93 mm×[1+9.4× $10^{-6} \times (440-20)$]=11.977 mm. The difference between the inner diameter of the outer structure and the peripheral diameter of the inner structure was 0.068 mm. The half of the difference (0.034 mm or 34 μm) was the distance. Use of materials which are different each other in coefficient of thermal expansion can improve efficiency in winding a magnetostrictive metal ribbon around an inner structure and then placing the cylindrical magnetostrictive metal ribbon in an outer structure.

Figure 9:
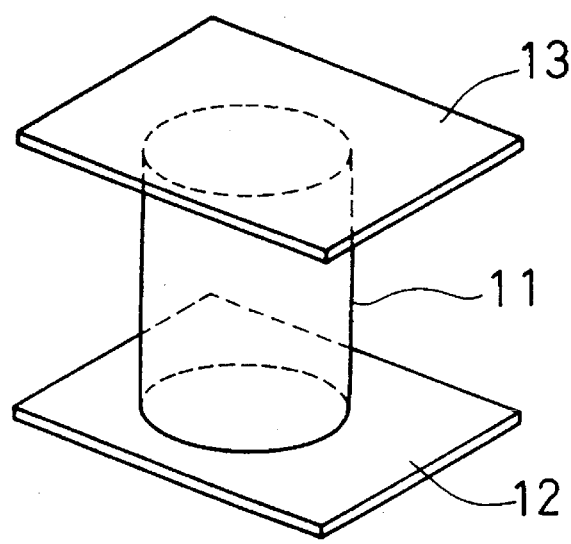
FIG. 9(a) and FIG. 9(b) show how to measure the loading strength in order to compare a magnetostrictive metal ribbon of this invention with an example of the prior art.
Figure 9:
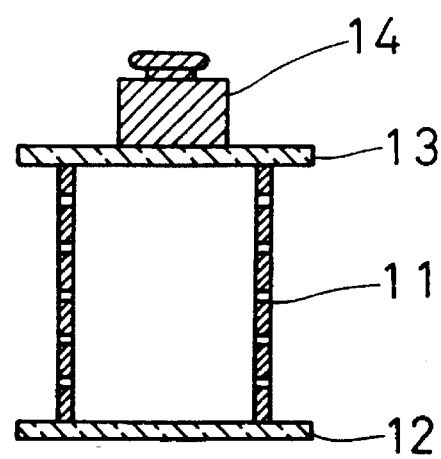

The strength of the cylindrical magnetostrictive metal ribbon in FIG. 3, which was acquired by the above-mentioned process, was measured. FIG. 9 shows how to measure the loading strength to compare the magnetostrictive metal ribbon of the invention and that of the prior art. A cylindrical magnetostrictive metal ribbon 11 was placed on a plate glass 12, on which a glass plate 14 (2 g in weight) was placed, on which a weight 14 was placed. Increasing the load in this way, the load was examined visually when the cylindrical magnetostrictive metal ribbon 11 was distorted. As a result, the cylindrical magnetostrictive ribbon shown in FIG. 3 of the embodiment began to deform at 80 to 120 g in weight.

Figure 10:
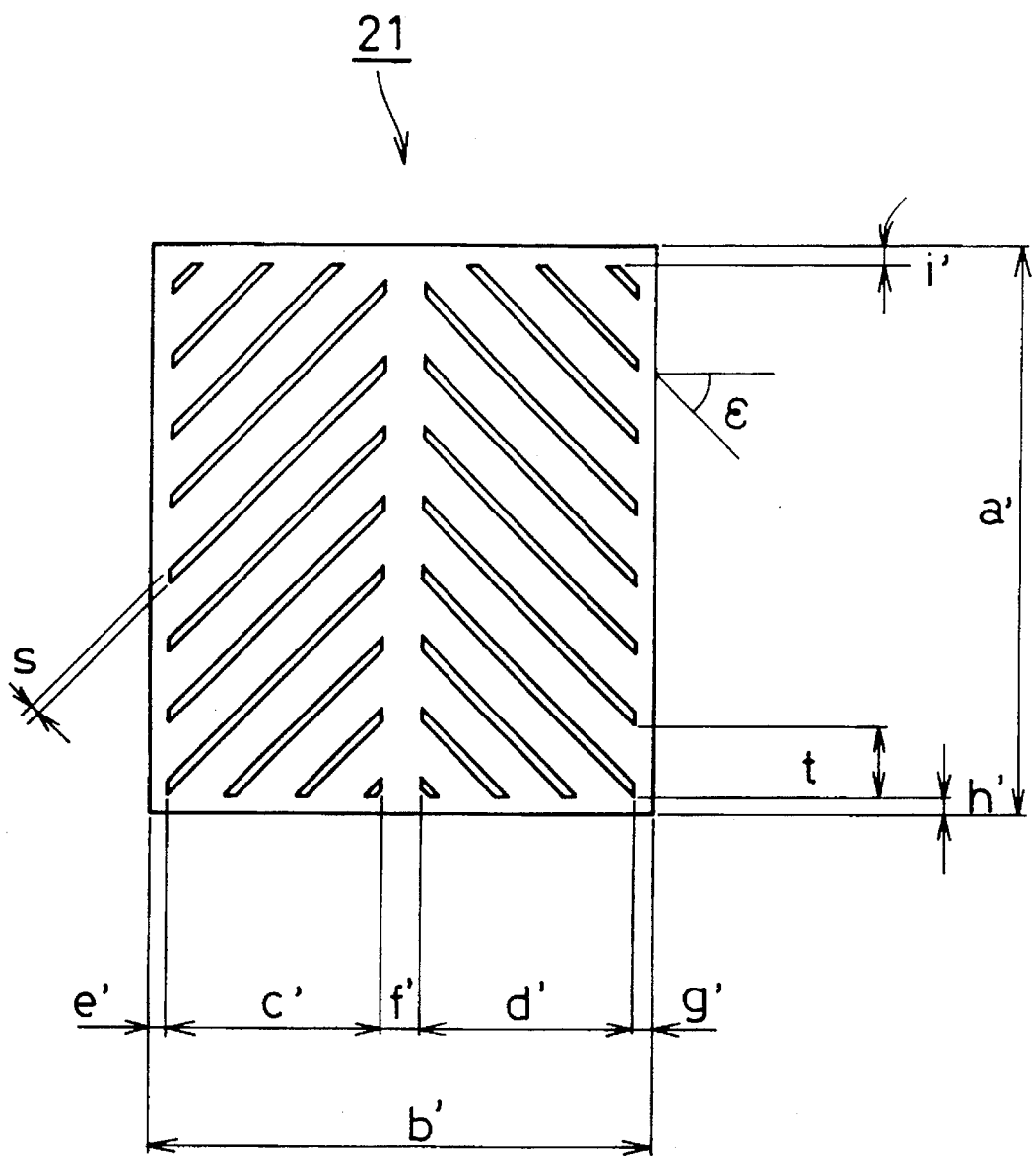
FIG. 10 shows an exploded view of a magnetostrictive metal ribbon formed with slits according to the prior art.

On the other hand, the cylindrical magnetostrictive metal ribbon (shown in FIG. 10) of the prior art (slit-type) was deformed at 4 to 6 g.

Figure 11:
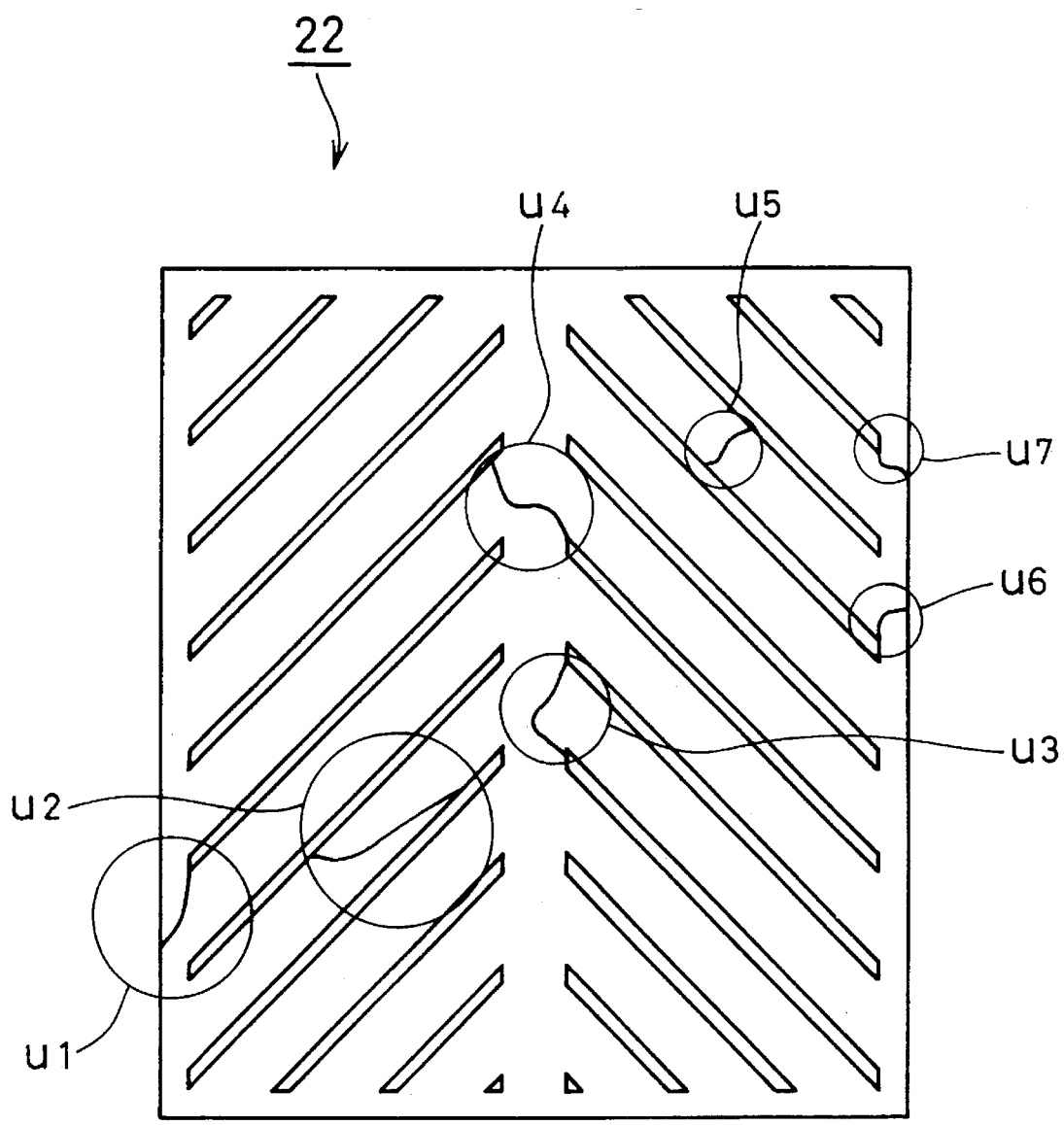
FIG. 11 explains the damaged parts of the magnetostrictive metal ribbon formed with slits according to the prior art.

The reason is considered that the slit-type of the prior art was extremely low in strength because forces concentrate on a point under stress. On the other hand, the sample of the embodiment was formed with plural hole groups in plural rows, which increased sequent parts in the direction of the face of the magnetostrictive alloy ribbon. As a result, even if stress was applied, the force was not concentrated but scattered, and the strength was increased. Substantially, the amorphous alloy ribbon shown in FIG. 10 of the prior art (in the figure, the slits is 0.3 mm wide (s), the repetition pitch is 2.0 mm (t)) was frequently damaged in the process of fixing to the annealing jig, taking off the magnetostrictive alloy ribbon 21 from the jig after the annealing process, and fixing to the shaft in order to form the torque sensor. The damage rate was higher especially after the annealing process. FIG. 11 shows the patterns of the damage classified through a number of experiments. In FIG. 11, encircled parts of the magnetostrictive alloy ribbon 22 ($u_1$ to $u_7$) show that damage was concentrated on the center parts or edges of the slits. The cause of the damage, though not certain, is considered that the stress is concentrated on edges because of the slit's distortion or the like by the outer force.

Figure 4:
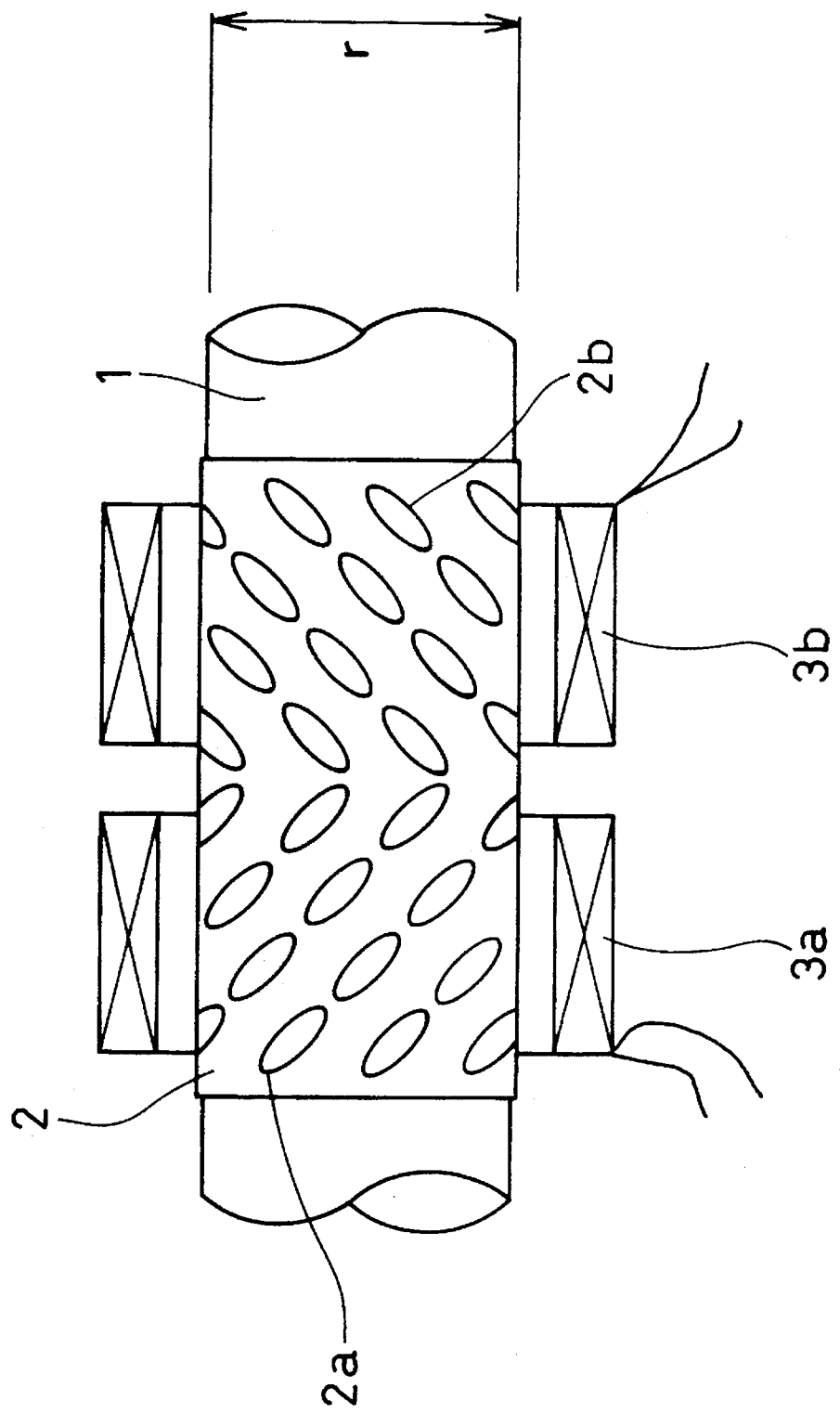
FIG. 4 shows the structure of a torque sensor of one embodiment of the invention.

FIG. 4 shows the structure of a torque sensor of one embodiment of the invention. The number 1 in the figure is a titanium shaft whose diameter (r) is 11.8 mm. Magnetostrictive alloy ribbon 2 is an amorphous magnetostrictive alloy ribbon produced by a single roller rapid quenching technique (e.g. it was quenched from 1,400° C. to room temperature at 10,000° C. per second) which was etched with plural rows of plural oval holes (2a and 2b) in the helical direction of +45° and −45° to the shaft longitudinally. The composition of the amorphous magnetostrictive alloy ribbon 2 was $Fe_{75}Cr_4Si_{12.5}B_{8.5}$. The thickness was 32 μm, the crystallization temperature was 460° C., and the saturation magnetostriction constant was 22 ppm. In the case of amorphous magnetostrictive alloy ribbon 2, an adhesive of a determined weight was applied to shaft 1. Then a magnetostrictive alloy ribbon was placed and glued to the shaft under pressure by nitrogen gas at 10 atm (10 kg/cm²) at 250° C. A torque sensor was produced by arranging coil means 3a and 3b outside the glued magnetostrictive alloy ribbon. The detection accuracy property of this torque sensor will be explained later.

Figure 6A:
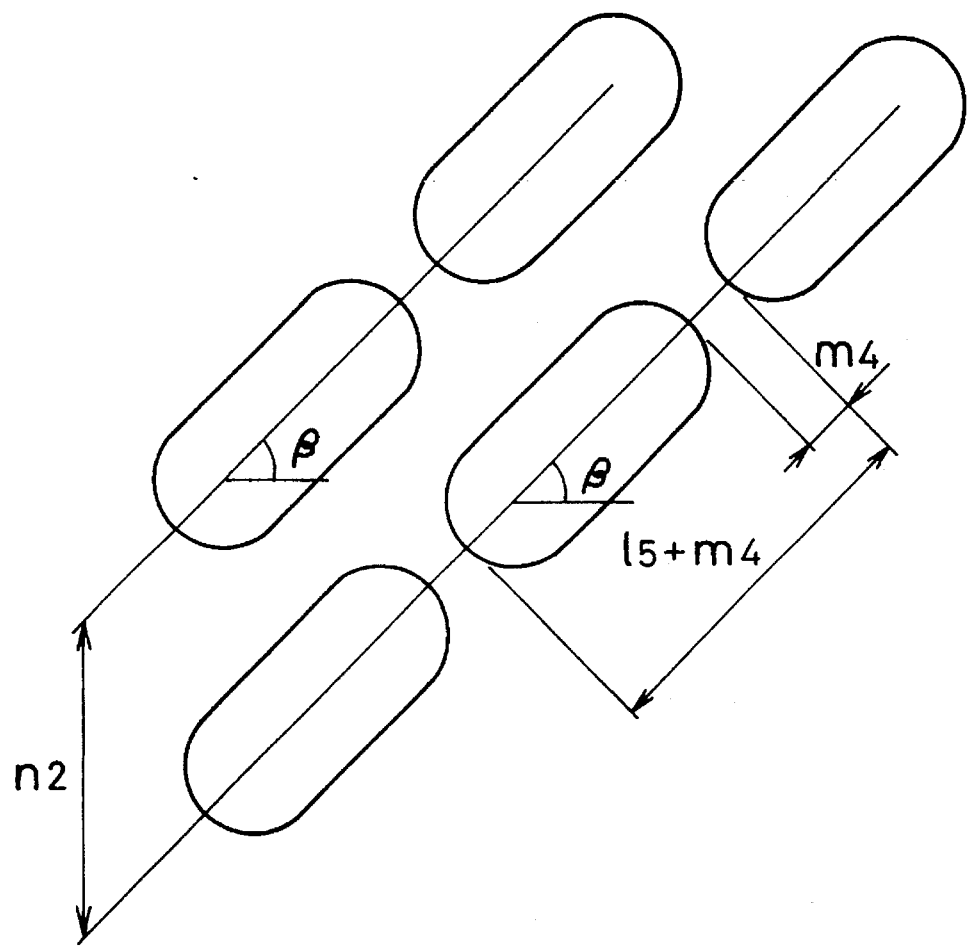
FIG. 6(a) and FIG. 6(b) show enlarged section views of a magnetostrictive metal ribbon formed with elliptic holes of one embodiment of the invention, and FIG. 6(a) explains plural holes, and FIG. 6(b) explains one of the holes.
Figure 6B:
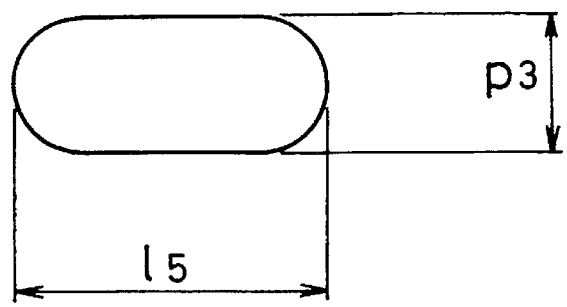
Figure 7:
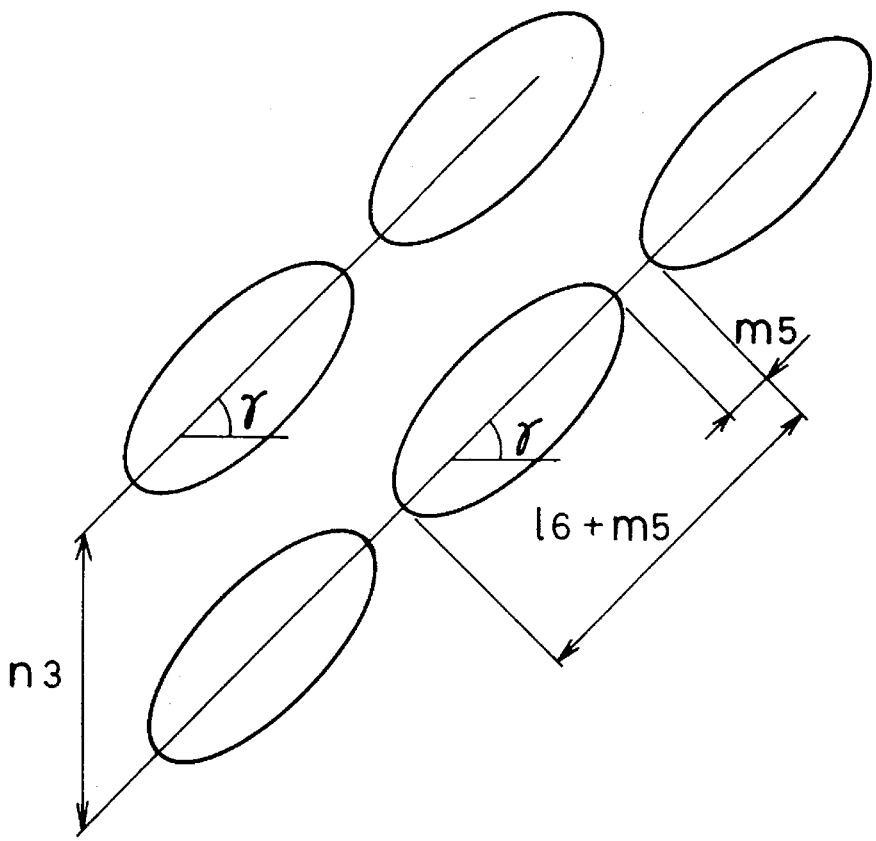
FIG. 7(a) and FIG. 7(b) show enlarged section views of a magnetostrictive metal ribbon formed with oval holes of one embodiment of the invention, and FIG. 7(a) explains plural holes, and FIG. 7 (b) explains one of the holes.
Figure 7:
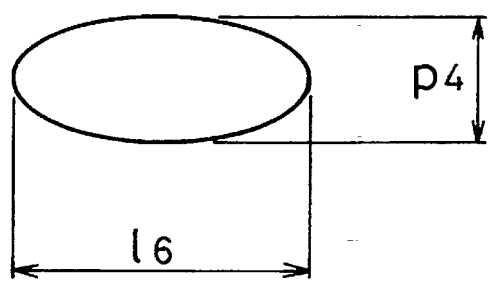
Figure 8A:
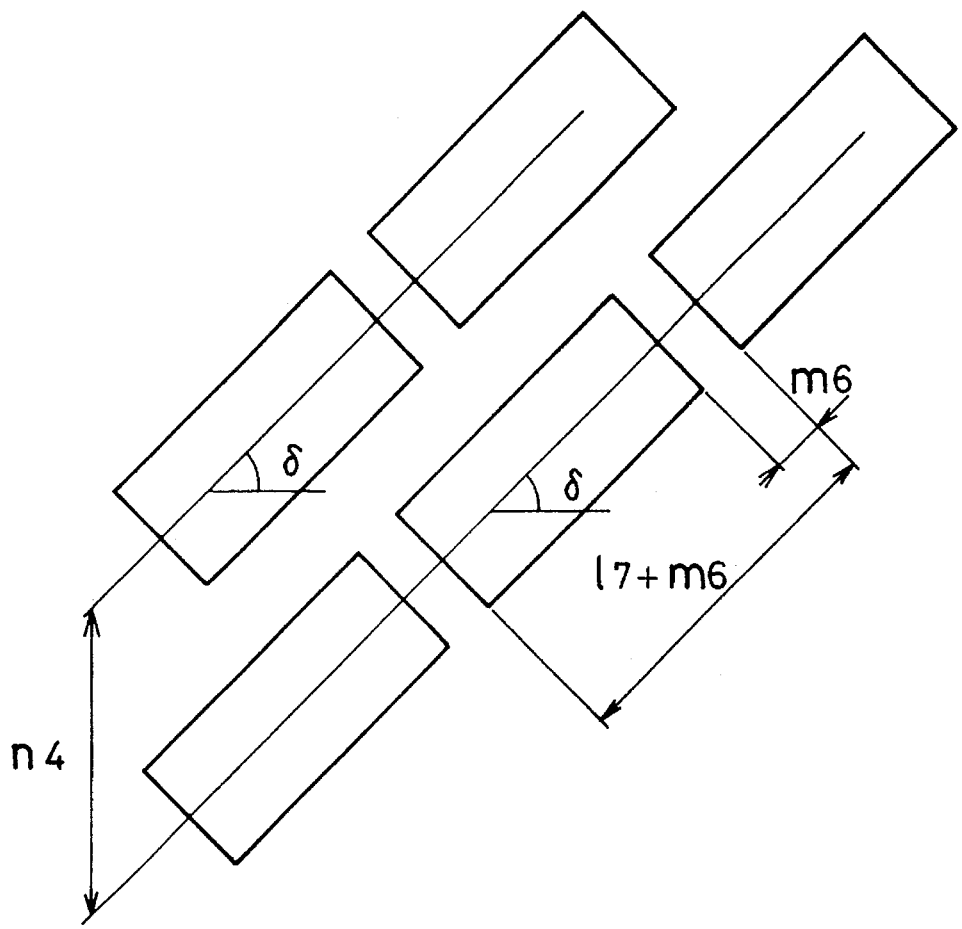
FIG. 8(a) and FIG. 8(b) show enlarged section views of a magnetostrictive metal ribbon formed with rectangle holes of one embodiment of the invention, and FIG. 8(a) explains plural holes, and FIG. 8(b) explains one of the holes.
Figure 8B:
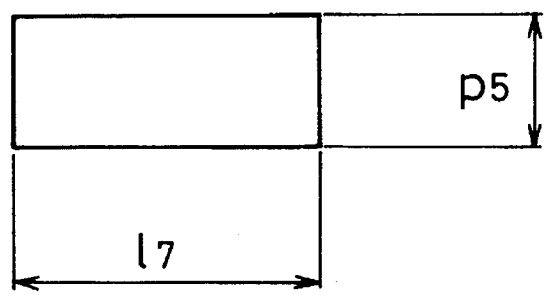

FIGS. 6, 7, and 8 show examples of etching on magnetostrictive alloy ribbons of other embodiments of this invention. In FIGS. 6 (a) (b), the preferable length of an elliptic hole ($l_5$) ranges from 2 to 5 mm, the width ($p_3$) ranges from 0.1 to 2 mm. A preferable distance between elliptic holes ($m_4$) ranges from 0.2 to 1 mm As a result the pitch ($l_5+m_4$) ranges from 2.2 to 6 mm. A preferable distance between a center of a hole line and the next one ($n_2$) ranges from 0.5 to 5 mm. Further, it is preferable that the angle β of a hole line is 45°, though the angle can be selected at random.

In FIGS. 7(a)(b), the preferable length of an oval hole ($l_6$) ranges from 2 to 5 mm, the preferable width ($p_4$) ranges from 0.1 to 2 mm. A preferable distance between oval holes ($m_5$) ranges from 0.2 to 1 min. As a result, the pitch ($a_6+m_5$) ranges from 2.2 to 6 mm. A preferable distance between a center of a hole line and the next one ($n_3$) ranges from 0.5 to 5 mm. Further, it is preferable that the angle γ of a hole line is 45°, though the angle can be selected at random.

In the following FIGS. 8(a)(b), the preferable length of a rectangle hole ($l_7$) ranges from 2 to 5 mm, the preferable width ($p_5$) ranges from 0.1 to 2 mm. A preferable distance between rectangle holes ($m_6$) ranges from 0.2 to 1 mm. As a result, the pitch ($l_7+m_6$) ranges from 2.2 to 6 mm A preferable distance between a center of a hole line and the next one ($n_4$) ranges from 0.5 to 5 mm. Further, it is preferable that the angle δ of a hole line is 45°, though the angle can be selected at random.

Damage to the magnetostrictive ribbons with above-mentioned holes were assessed. Forty samples were used respectively. In the case of holes without angles in FIGS. 6 and 7, there was no damage. In the case of the rectangle holes in FIG. 8, very few samples were damaged. Yet the damage rate of every hole was lower than that of the ribbon with slits.

Four kinds of amorphous ribbons shown in FIGS. 1, 2, 3, 7, 8, 10 were glued to form torque sensors, then detection circuits were incorporated for the assessment of their output properties. As detection parts, resistances were connected to coil means (3a and 3b) to compose bridge circuits, and the difference of the peak value voltages across the coil means (3a and 3b) became output. If the adhesion of magnetostrictive alloy becomes uneven, the impedances of soil means 3a and 3b differ from each other. As a result, an apparent output may be generated even if torque is not applied (torque=0 kgfcm). Therefore, torque is represented by the horizontal axis, and sensor output is represented by the vertical axis. The more the output voltage approaches to zero (V), the more ideal the adhesion is, if torque is not applied (torque=0 kgfcm).

Data about the substantial output unevenness are shown in FIG. 12, which represents the torque sensor using magnetostrictive alloy ribbon in FIGS. 1, 2, and 3. All the measurements were carried out at room temperature. The slashed parts in the figures show the range of unevenness of the produced sensor. The solid line shows the output for the minimum adhesion unevenness, or alternatively, the ideal adhesion. The measurement was carried out in the 100 kgfcm of torque range.

Figure 13:
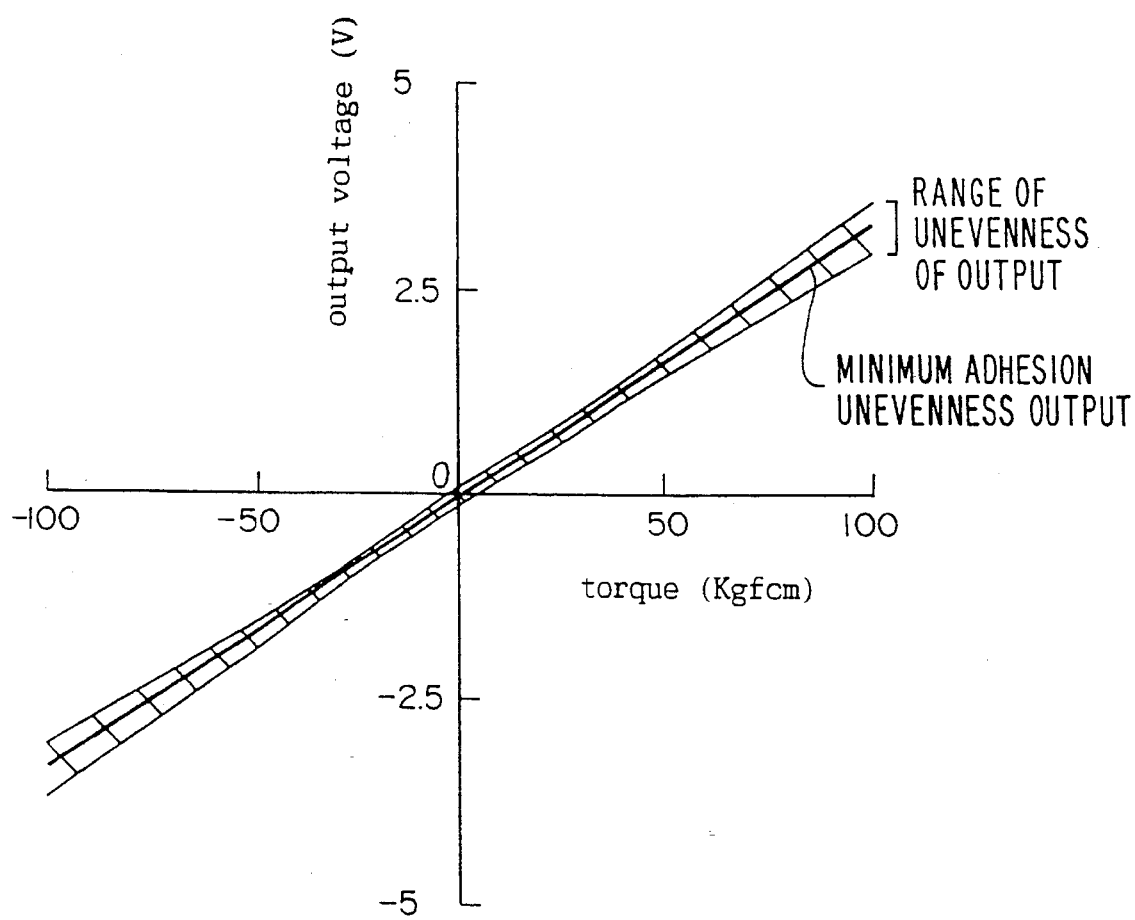
FIG. 13 shows an example of the optimum output and unevenness range of a torque sensor which was formed with oval holes of one embodiment of the invention.
Figure 14:
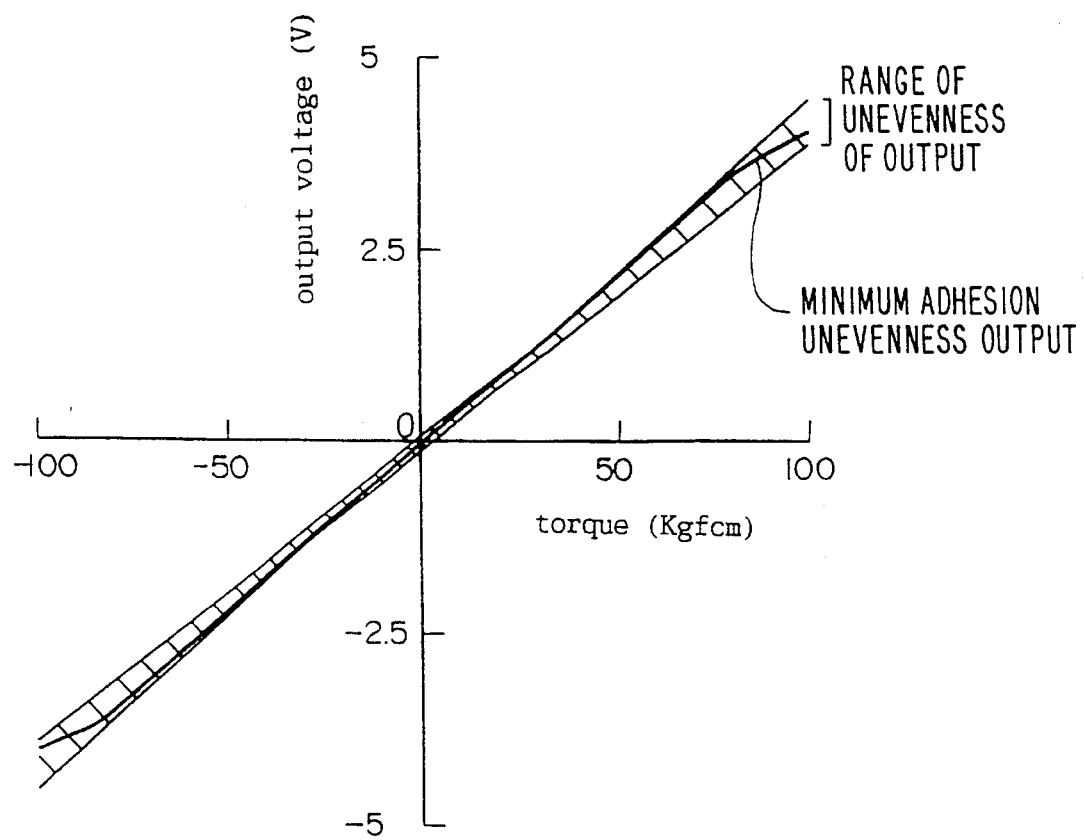
FIG. 14 shows an example of the optimum output and unevenness range of a torque sensor which was formed with rectangle holes of one embodiment of the invention.

In the same way, data about the substantial output unevenness are shown in FIG. 13, which represents the torque sensor using the magnetostrictive alloy ribbon in FIG. 7. Data about the substantial output unevenness are shown in FIG. 14, which describes the torque sensor using the magnetostrictive alloy ribbon in FIG. 8. Data about the substantial output unevenness are shown in FIG. 15, which describes the torque sensor using the magnetostrictive alloy ribbon of the prior art in FIG. 10.

Output voltages of FIGS. 1, 2, 3, 7, 8 and 10 were compared by using the same torque. In the comparison, the torque sensor with slits of the prior art was satisfactory. However, the torque sensors formed with hole groups of the invention was much superior in output repeatability and symmetry. The shape of the hole made less difference. The elliptic holes in FIGS. 1, 2, and 3 had the best linearity though the cause is not certain. One of the plausible reasons is that the effect of magnetic anisotorophy due to the shape and every bending stress which a ribbon is subjected to during production may change depending on the hole position. Clarification of the cause can improve the output linearity by refining the shape and the arrangement of the holes.

Figure 15:
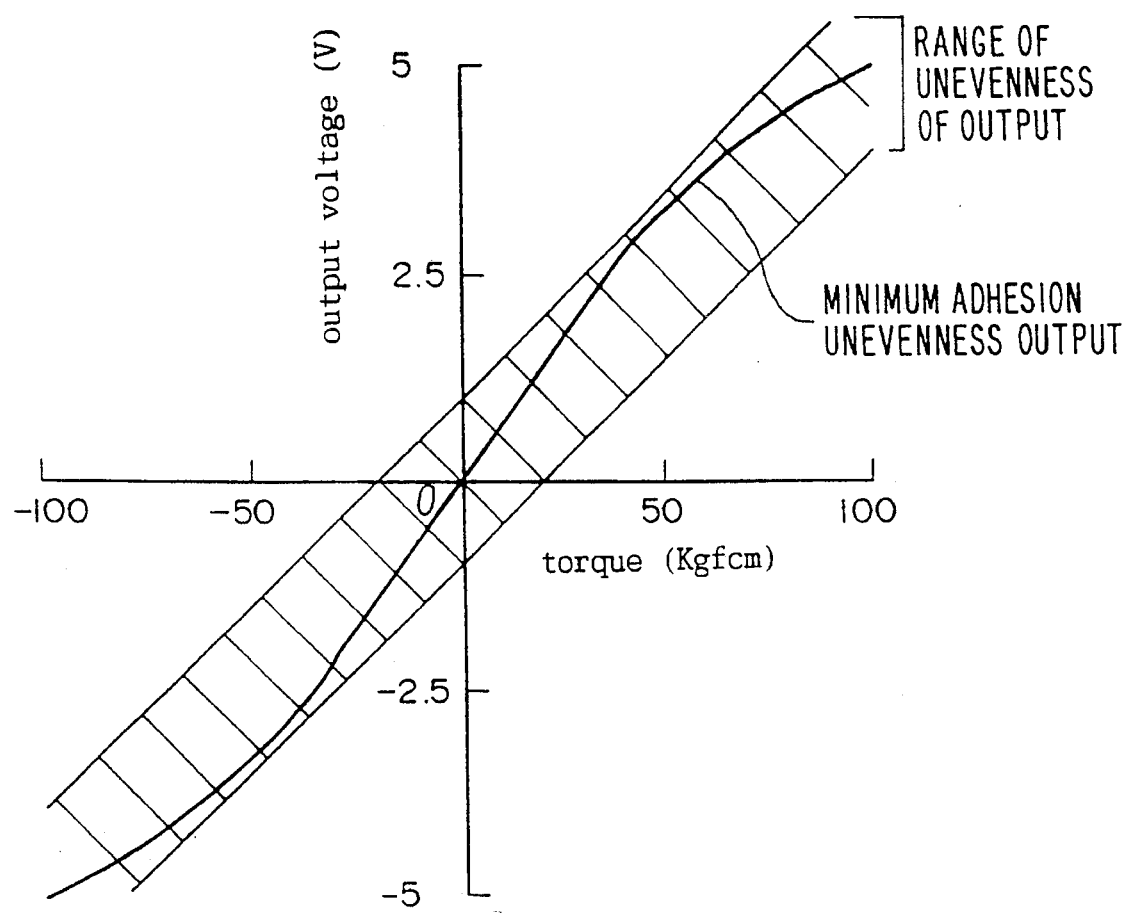
FIG. 15 shows an example of the optimum output and unevenness range of a torque sensor which was formed with slits of the prior art.

The following conclusions can be made after comparing FIG. 12 which shows the measured output data of one embodiment in this invention, and FIG. 15 which shows the measured output data of the prior art.

(1) In the example of this invention, unevenness of output voltage does not exceed 10%, or especially 2% of the torque's full-scale (100 kgfcm) when torque is 0 kgfcm, while the unevenness range of the prior art is about 20%.

(2) In the example of this invention, when represented graphically the characteristics show substantially a straight line, while the characteristics of the prior art are S-shaped, which means that the data of the prior art is not reliable.

Close examination was made about spacing between two holes (m) shown in FIGS. 1, 2, 3, 7, and 8, in the relation to damage. The result is that output raises higher as the spacing m is smaller, but the probability of damage during production becomes high when m becomes 0.1 mm or less. If m is fixed at 0.2 mm, output of torque sensor becomes higher as hole length (l) is longer. However, if it exceeds 4 mm, damage probability gradually becomes high. In any case, rectangle holes were damaged to some extent.

The above-mentioned cases employed hole groups arranged in the direction of 45°. Other angles will probably bring about a similar result.

In addition to the above-mentioned, longitudinal direction of holes and hole shape can be varied.

The above-mentioned is an example of a torque detection range (100 gcm) of a torque sensor whose shaft is 11.8 mm in diameter.

In the case of detecting a larger torque, torque detection range can be expanded theoretically in proportion to the cube power of the diameter of the shaft. For instance, if the diameter of the shaft becomes 20 mm, it is possible to obtain output characteristics whose torque scale is 4.87 times of the one shown in FIGS. 12, 13, 14. (Torque detection range can be expanded up to 487 gcm.)

It is preferable that the dimension of the hole shown in FIG. 2 ($l_1$ to $l_4$, $m_1$ to $m_3$, $p_1$, $p_2$, n) is in the range of abovementioned embodiment in order to prevent damage to the metal ribbon, when the dimensions of the magnetostrictive metal ribbon (a and b) shown in FIG. 1 are magnified 1.69 times to match the diameter of the shaft.

The embodiments described above are for the purpose of illustration and should not be considered to limit the scope of the invention in any way.

What is claimed is:

1. A torque sensor comprising a magnetostrictive alloy ribbon fixed on a surface of a shaft having a longitudinal axis and means for detecting magnetic change arranged outside said magnetostrictive alloy ribbon, wherein said magnetostrictive alloy ribbon has three or more adjacent rows of elliptical or rectilinear holes formed in said magnetostrictive alloy ribbon, said rows of holes being arranged along the longitudinal axis of said shaft so that major axes of the holes in each of said rows are parallel to each other and so that said major axes are disposed in oblique directions substantially at angles of +45° and −45° to the longitudinal axis of said shaft.

2. A torque sensor according to claim 1, wherein the magnetostrictive alloy ribbon is formed cylindrically around said shaft so that the longitudinal direction is substantially vertical, and is capable of withstanding a load of 10 g or more uniformly applied on top of the ribbon.

3. A torque sensor according to claim 1, wherein the magnetostrictive alloy ribbon is formed cylindrically around said shaft so that the longitudinal direction is substantially vertical, and is capable of withstanding a load of 80 g or more uniformly applied on top of the ribbon.

4. A torque sensor according to claim 1, wherein the holes are from 2 to 5 mm long and from 0.1 to 2 mm wide.

5. A torque sensor according to claim 1, wherein said holes have a curved shape.

6. A torque sensor according to claim 1, wherein the magnetostrictive metal ribbon comprises an amorphous magnetostrictive alloy.

7. A torque sensor according to claim 6, wherein the amorphous magnetostrictive alloy is at least one alloy selected from the group consisting of Fe—Cr—Si—B-based, Fe—Nb—Si—B-based, Fe—V—Si—B-based, Fe—Co—Si—B-based, Fe—W—Si—B-based, Fe—Ni—Cr—Si—B-based, Fe—Ni—Nb—B-based, and Fe—Ni—Mo—B-based alloy.

8. A torque sensor according to claim 6, wherein the amorphous magnetostrictive alloy is $Fe_{75}Cr_4Si_{12.5}B_{8.5}$.

9. A torque sensor according to claim 1, wherein the means for detecting magnetic change are coils.

10. A torque sensor according to claim 1, wherein unevenness of output voltage is 10% or less per full-scale of torque (100 kgfcm), when torque is 0 kgfcm.

11. A torque sensor according to claim 1, having output voltage characteristics which are substantially linear when represented graphically.

12. A torque sensor according to claim 1, wherein the spacing between edges of adjacent holes in each row is from 0.1 to 1 mm and the spacing between edges of adjacent rows of holes is from 0.5 to 5 mm.

\* \* \* \* \*